(12) United States Patent
St. Amand et al.

(10) Patent No.: US 11,362,027 B2
(45) Date of Patent: Jun. 14, 2022

(54) SEMICONDUCTOR DEVICES AND METHODS OF MANUFACTURING SEMICONDUCTOR DEVICES

(71) Applicant: Amkor Technology Singapore Holding Pte. Ltd, Valley Point (SG)

(72) Inventors: Roger D. St. Amand, Tempe, AZ (US); Louis W. Nicholls, Gilbert, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/805,027

(22) Filed: Feb. 28, 2020

(65) Prior Publication Data

US 2021/0272887 A1   Sep. 2, 2021

(51) Int. Cl.
| | |
|---|---|
| H01L 23/498 | (2006.01) |
| H01L 25/00 | (2006.01) |
| H01L 25/065 | (2006.01) |
| H01L 25/18 | (2006.01) |
| H01L 23/00 | (2006.01) |
| H01L 21/48 | (2006.01) |
| H01L 21/56 | (2006.01) |
| H01L 23/31 | (2006.01) |

(52) U.S. Cl.
CPC .... *H01L 23/49816* (2013.01); *H01L 21/4853* (2013.01); *H01L 21/56* (2013.01); *H01L 23/3185* (2013.01); *H01L 23/49822* (2013.01); *H01L 24/11* (2013.01); *H01L 24/73* (2013.01); *H01L 25/0657* (2013.01); *H01L 25/18* (2013.01); *H01L 25/50* (2013.01); *H01L 2224/73253* (2013.01)

(58) Field of Classification Search
CPC .................................................. H01L 25/0657
See application file for complete search history.

(56) References Cited

U.S. PATENT DOCUMENTS

| | | |
|---|---|---|
| 6,828,655 B2 | 12/2004 | Pu et al. |
| 7,960,210 B2 | 6/2011 | Trezza |
| 2044/0065963 | 4/2004 | Kamezos |

(Continued)

*Primary Examiner* — Yu-Hsi D Sun
(74) *Attorney, Agent, or Firm* — Kevin B. Jackson

(57) ABSTRACT

In one example, a semiconductor device includes a substrate with a top side, a bottom side, and a conductive structure. A first electronic component includes a first side, a second side, and first component terminals adjacent to the first side. The first component terminals face the substrate bottom side and are connected to the conductive structure. A second electronic component comprises a first side, a second side, and second component terminals adjacent to the second electronic component first side. The second electronic component second side is connected to the first electronic component second side so that the first component terminals and the second component terminals face opposite directions. Substrate interconnects are connected to the conductive structure, and a bottom encapsulant covers the substrate bottom side, the first electronic component, the second electronic component, and the substrate interconnects. Portions of the second component terminals and the substrate interconnects are exposed from a bottom side of the bottom encapsulant. Other examples and related methods are also disclosed herein.

19 Claims, 14 Drawing Sheets

(56) References Cited

U.S. PATENT DOCUMENTS

| | | |
|---|---|---|
| 2004/0222508 A1 | 11/2004 | Aoyagi |
| 2007/0210433 A1 | 9/2007 | Subraya et al. |
| 2008/0017968 A1 | 1/2008 | Choi et al. |
| 2009/0072375 A1* | 3/2009 | Song .................. H01L 25/0657 257/686 |
| 2012/0306078 A1 | 12/2012 | Pagaila et al. |
| 2018/0358288 A1* | 12/2018 | Lee ........................ H01L 24/20 |

* cited by examiner

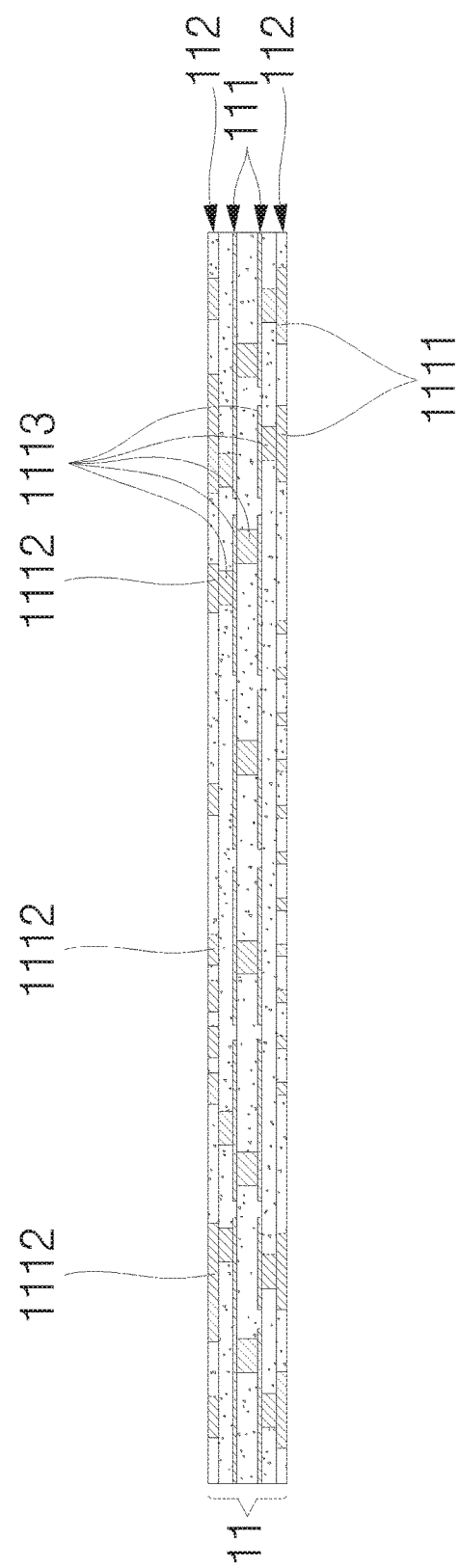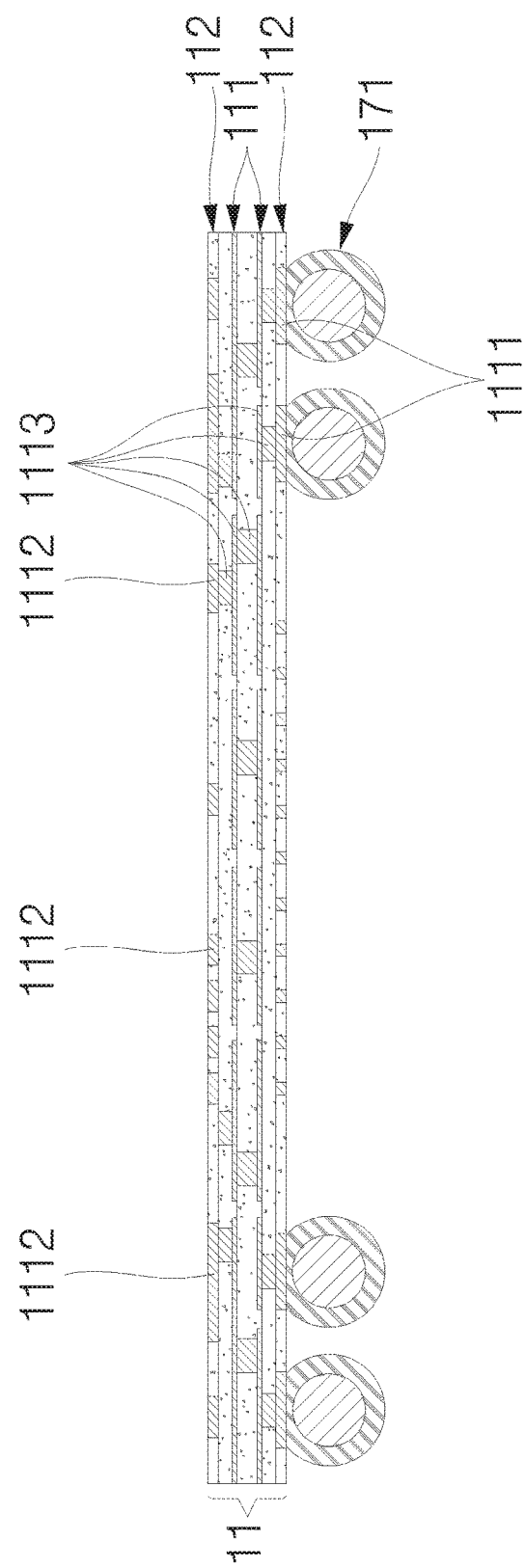
FIG. 2A
FIG. 2B

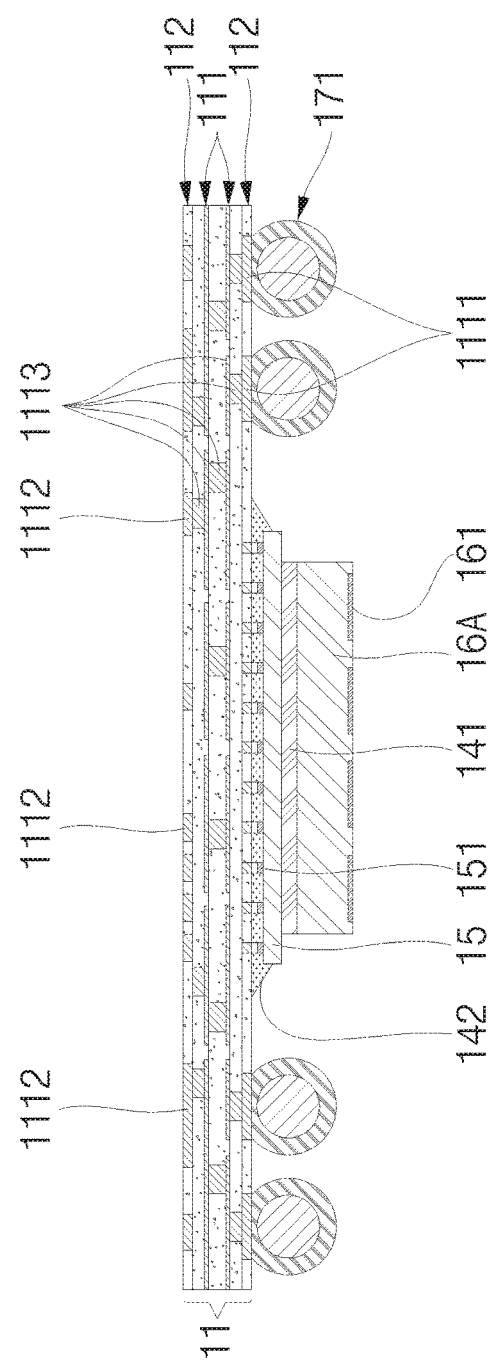
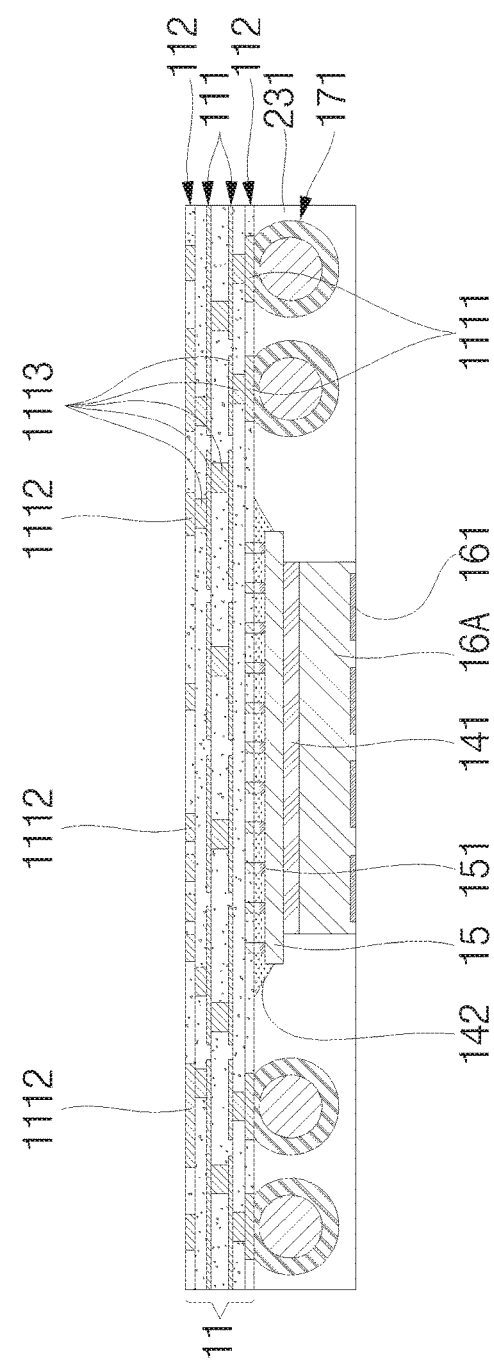
FIG. 4A
FIG. 4B

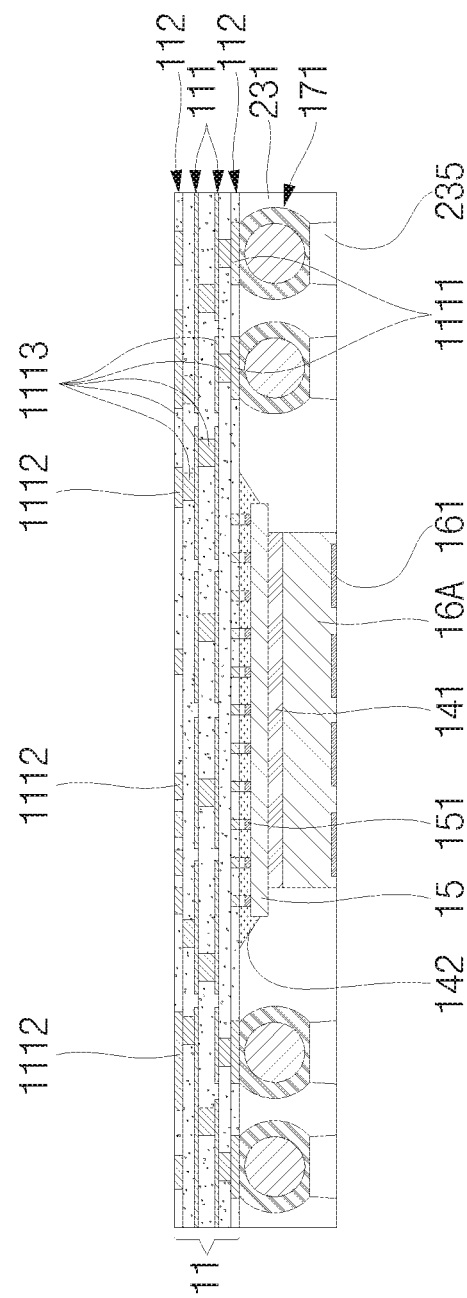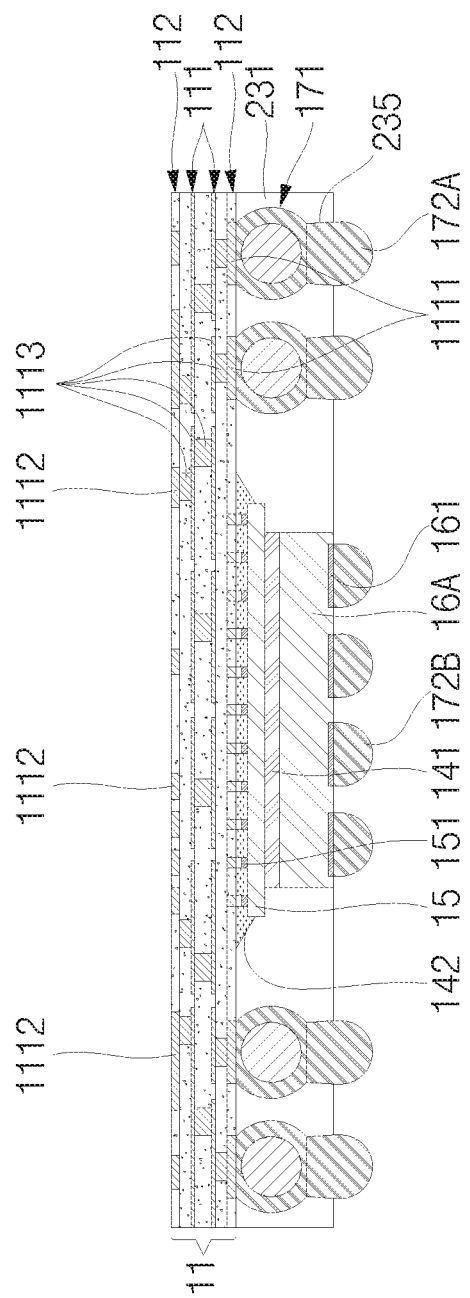

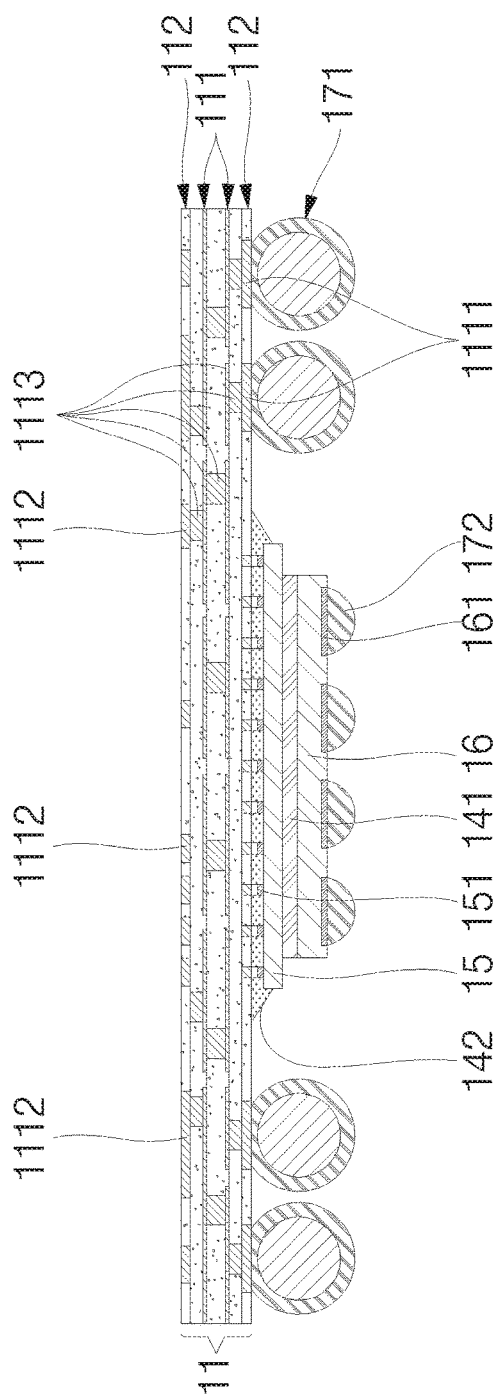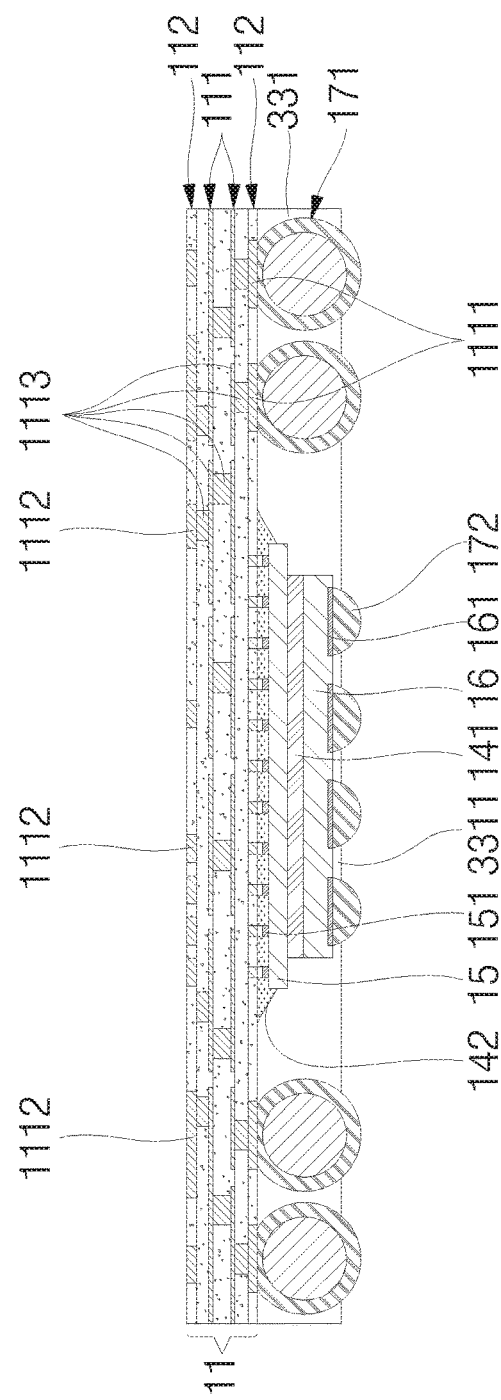

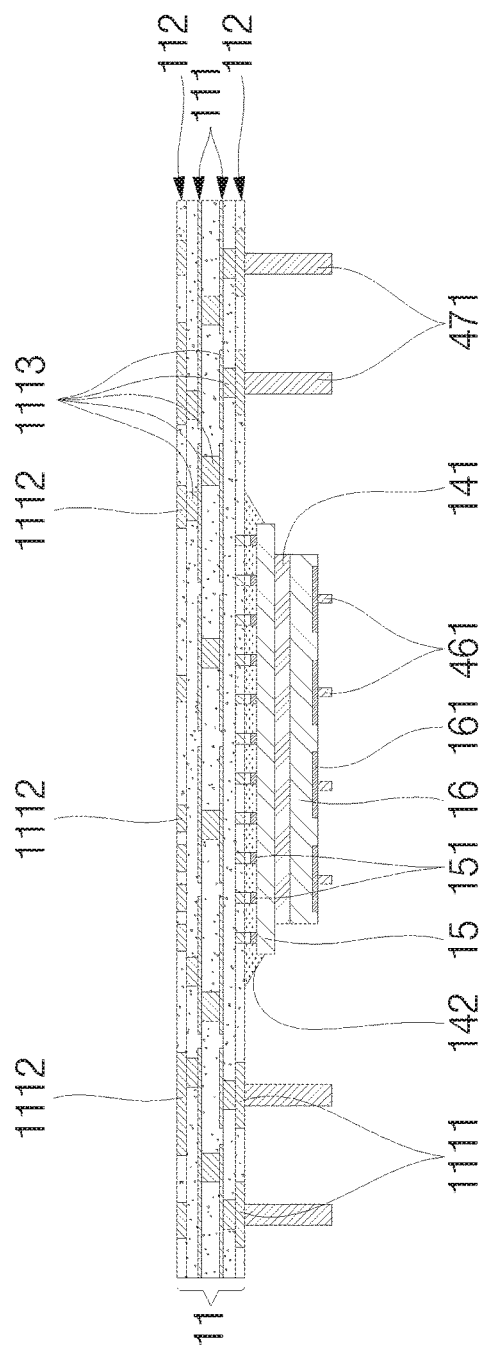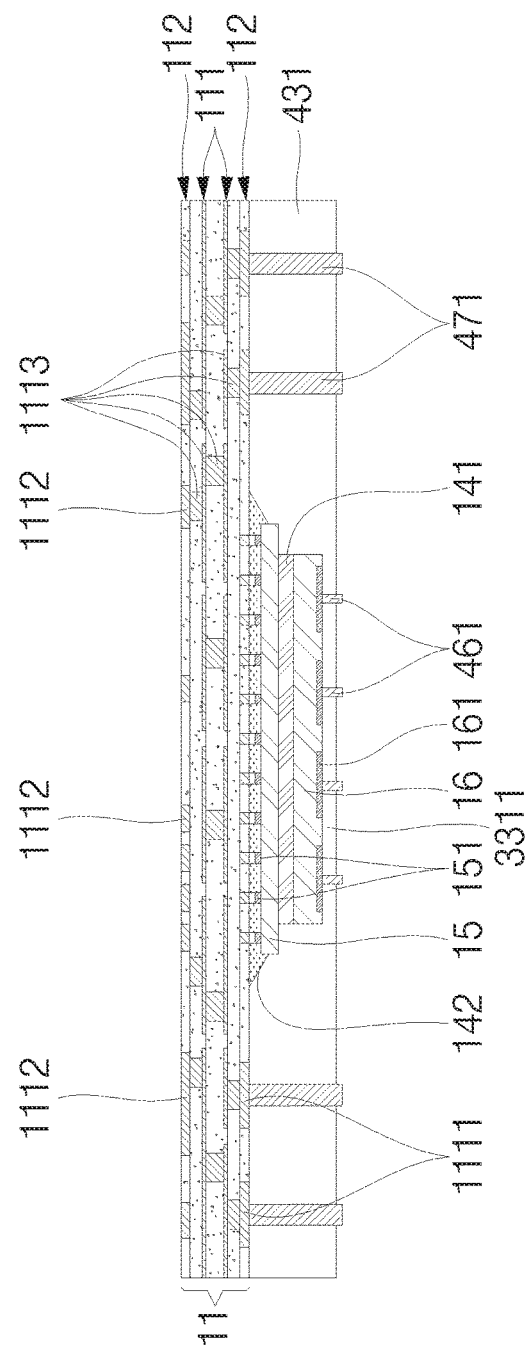

SEMICONDUCTOR DEVICES AND METHODS OF MANUFACTURING SEMICONDUCTOR DEVICES

CROSS-REFERENCE TO RELATED APPLICATIONS

Not Applicable.

TECHNICAL FIELD

The present disclosure relates, in general, to electronic devices, and more particularly, to semiconductor devices and methods for manufacturing semiconductor devices

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, and 2G show cross-sectional views of an example method for manufacturing an example semiconductor device.

FIGS. 4A, 4B, 4C, 4D, and 4E show cross-sectional views of an example method for manufacturing an example semiconductor device.

FIGS. 6A to 6B show cross-sectional views of an example method for manufacturing an example semiconductor device.

FIGS. 8A, 8B, and 8C show cross-sectional views of an example method for manufacturing an example semiconductor device.

Figure 1:
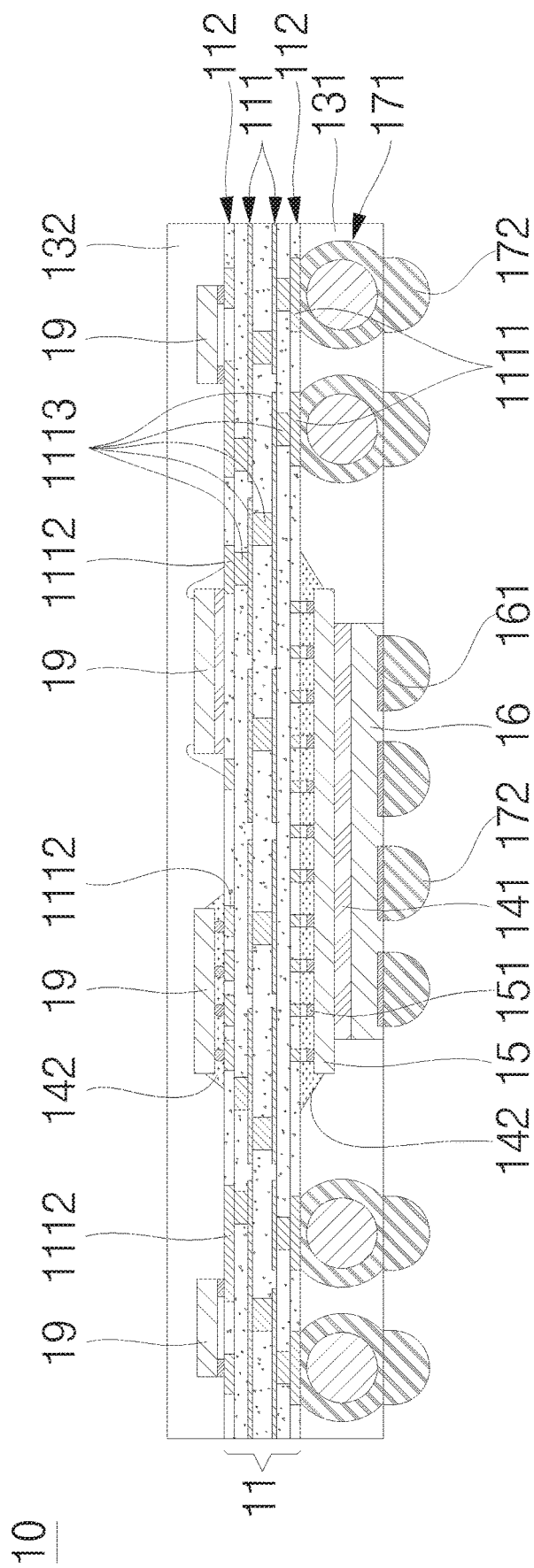
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," and/or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

The present description includes, among other features, an electronic device and associated methods that relate to 3D packaging. In some examples, package-on-package configurations are combined with device stacking configurations within a single substrate. The devices and methods provide, among other things, higher levels of integration with one or more substrates.

In an example, a semiconductor device includes a substrate comprising a substrate top side, an opposing substrate bottom side, and a conductive structure, wherein the conductive structure comprises substrate top terminals adjacent to the substrate top side; substrate bottom terminals adjacent to the substrate bottom side; and conductive paths coupling the substrate top terminals to the substrate bottom terminals. A first electronic component comprises a first electronic component first side, a first electronic component second side opposite to the first electronic component first side, and first component terminals adjacent to the first electronic component first side and coupled to the substrate bottom terminals. A second electronic component comprises a second electronic component first side, a second electronic component second side opposite to the second electronic component first side and coupled to the first electronic component second side, and second component terminals adjacent to the second electronic component first side. Substrate interconnects are coupled to the substrate bottom terminals. A bottom encapsulant covers the substrate bottom side, the first electronic component, the second electronic component, and the substrate interconnects. The first electronic component and the second electronic component are interposed between the second component terminals and the substrate bottom side, and portions of the second component terminals and the substrate interconnects are exposed from the bottom encapsulant.

In an example, a semiconductor device includes a substrate comprising a substrate top side, an opposing substrate bottom side, and a conductive structure. A first electronic component includes a first electronic component first side, a first electronic component second side opposite to the first electronic component first side, and first component terminals adjacent to the first electronic component first side. The first component terminals face the substrate bottom side and are connected to the conductive structure. A second electronic component comprises a second electronic component first side, a second electronic component second side opposite to the second electronic component first side, and second component terminals adjacent to the second electronic component first side. The second electronic component second side is connected to the first electronic component second side so that the first component terminals and the second component terminals face opposite directions. Substrate interconnects are connected to the conductive structure adjacent to the substrate bottom side. A bottom encapsulant covers the substrate bottom side, the first electronic component, the second electronic component, and the substrate interconnects. Portions of the second component terminals and the substrate interconnects are exposed from a bottom side of the bottom encapsulant.

In an example, a method of forming a semiconductor device comprises providing a substrate with a substrate top side, an opposing substrate bottom side, and a conductive structure. The method includes providing a first electronic component comprising a first electronic component first side, a first electronic component second side opposite to the first electronic component first side, and first component terminals adjacent to the first electronic component first side. The method includes providing a second electronic component comprising a second electronic component first side, a second electronic component second side opposite to the second electronic component first side, and second component terminals adjacent to the second electronic component first side. The method includes providing substrate interconnects. The method includes in any order: connecting the first component terminals to the conductive structure adjacent to the substrate bottom side such that first component terminals are interposed between the first electronic component first surface and the substrate bottom side, connecting the substrate interconnects to the conductive structure adjacent to the substrate bottom side, and connecting the second electronic component second side to the first electronic component second side so that the first component terminals and the second component terminals face opposite directions. The method includes providing a bottom encapsulant covering the substrate bottom side, the first electronic component, the second electronic component, and the substrate interconnects. Portions of the second component terminals and of the substrate interconnects are exposed from a bottom side of the bottom encapsulant.

Other examples are included in the present disclosure. Such examples may be found in the figures, in the claims, and/or in the description of the present disclosure.

FIG. 1 shows a cross-sectional view of an example semiconductor device 10. In the example shown in FIG. 1, semiconductor device 10 can comprise substrate 11, first electronic component 15, second electronic component 16, adhesive 141, underfill 142, substrate interconnects 171, external interconnects 172, bottom encapsulant 131, top encapsulant 132, and top component 19.

Substrate 11 can comprise conductive structure 111 having one or more conductive layers, including substrate bottom terminals 1111, substrate top terminals 1112, or conductive paths 1113. Substrate 11 can also comprise dielectric structure 112 having one or more dielectric layers bounding or stacked with the one or more conductive layers of conductive structure 111. First electronic component 15 can comprise first component terminals 151. Second electronic component 16 can comprise second component terminals 161.

Substrate 11, substrate interconnects 171, external interconnects 172, bottom encapsulant 131 and top encapsulant 132 can be referred to as a semiconductor package and such package can provide protection for first electronic components 15, second electronic components 16, and top component 19 from external elements and/or environmental exposure. The semiconductor package can provide electrical coupling between external electrical components and external interconnects 172.

FIGS. 2A, 2B, 2C, 2D, 2E, 2F, and 2G show cross-sectional views of an example method for manufacturing semiconductor device 10.

FIG. 2A shows a cross-sectional view of at an early stage of manufacture semiconductor device 10. In the example shown in FIG. 2A, substrate 11 can be provided. Substrate 11 can comprise conductive structure 111 and dielectric structure 112. Conductive structure 111 can comprise substrate bottom terminals 1111 provided at a bottom side of dielectric structure 112, substrate top terminals 1112 provided at a top side of dielectric structure 112, and conductive paths 1113 provided along, through, or within dielectric structure 112.

In some examples, conductive structure 111 comprises substrate bottom terminals 1111, substrate top terminals 1112 and conductive paths 1113. Substrate bottom terminals 1111 can be exposed at the bottom side of dielectric structure 112. Substrate bottom terminals 1111 can comprise or be referred to as pads, lands, under bump metallizations (UBMs), or bumps. Substrate top terminals 1112 can be exposed at the top side of dielectric structure 112. Substrate top terminals 1112 can comprise or be referred to as pads, lands, UBMs, or bumps. Conductive paths 1113 can be extend on, along, or through the one or more layers of dielectric structure 112, and can electrically connect substrate bottom terminals 1111 to substrate top terminals 1112. Conductive paths 1113 can comprise or be referred to as circuit patterns, wiring patterns, traces, or vias.

In some examples, substrate bottom terminals 1111, substrate top terminals 1112, or conductive paths 1113 can comprise conductor materials such as copper, aluminum, gold, silver, palladium, nickel, titanium, titanium tungsten or vanadium. In some examples, a bonding material, such as gold, silver, palladium, nickel, vanadium, solder, or alloys, can be formed on any of substrate bottom terminals 1111 or substrate top terminals 1112. In some examples, conductive structure 111 can have a line/space/thickness ranging from about 2/2/5 μm (micrometer) to about 40/40/20 μm. Such conductive structure 111 can electrically connect first electronic component 15 or top component 19 to an external electronic component.

Dielectric structure 112 can comprise one or more dielectric layers bounding or stacked with the one or more conductive layers of conductive structure 111. Dielectric structure 112 can expose one or more portions of conductive structure 111, such as substrate top terminals 1112 at the top side of substrate 11, substrate bottom terminals 1113 at the bottom side of substrate 11, or lateral edges of conductive paths 1113 at the lateral sides of substrate 11. In some examples, dielectric structure 112 can comprise or be referred to as an insulating structure. In some examples, dielectric structure 112 can comprise one or more layers of polyimide, benzocyclobutene, polybenzoxazole, pre-preg, fiberglass reinforcement, or epoxy. In some examples, dielectric structure 112 can have a thickness in the range of about 2 nm to about 150 nm. Such dielectric structure 112 can be combined with conductive structure 111 to support conductive structure 111, and can maintain a desired shape for substrate 11.

In some examples, substrate 11 can have an overall thickness in the range of about 2 μm to about 600 μm. Such substrate 11 can support first electronic components 15, second electronic components 16, or top components 19, and can electrically connect first electronic components 15 or top components 19 to external electronic components.

In some examples, substrate 11 can be a redistribution layer ("RDL") substrate. RDL substrates can comprise one or more conductive redistribution layers and one or more dielectric layers that: (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in other examples the dielectric materials of the RDL substrates can comprise one or more inorganic dielectric layers. Some examples of inorganic dielectric layer(s) can comprise silicon nitride ($Si_3N_4$), silicon oxide ($SiO_2$), and/or SiON. The inorganic dielectric layer(s) can be formed by growing the inorganic dielectric layers using an oxidation or nitridization process instead of using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, and/or other inorganic particles for rigidity and/or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate that omits the permanent core structure, and the dielectric and conductive layers can be formed on a sacrificial carrier and is removed after formation of the dielectric and conductive layers and before attachment to the electronic device. The pre-formed substrate can be rereferred to as a printed circuit board (PCB) or a laminate substrate. Such pre-formed substrate can be formed through a semi-additive or modified-semi-additive process.

FIG. 2B shows a cross-sectional view at a later stage of manufacture of semiconductor device 10. In the example shown in FIG. 2B, substrate interconnects 171 can be provided. Substrate interconnects 171 can be coupled to substrate bottom terminals 1111. In some examples, substrate interconnects 171 can be coupled to bottom terminals 1111 provided around substrate 11. In some examples, substrate interconnects 171 can comprise or be referred to as metal-core balls (of a metal other than solder), solder-coated metal-core balls, solder balls, bumps, or posts, such as pillars or vertical wires In some examples, flux can be applied to bottom terminals 1111 of substrate 11 and then substrate interconnects 171 can by placed on the flux, and substrate interconnects 171 can be coupled to substrate bottom terminals 1111 through a mass reflow process or a laser assisted bonding process. The flux can be volatized and removed.

In some examples, when substrate interconnects 171 comprise solder-coated metal-core balls, solder can surround the metal-core balls, and the solder can be melted for coupling with substrate bottom terminals 1111. In some examples, the metal-core balls can couple with substrate bottom terminals 1111 through the solder coating or can directly contact substrate bottom terminals 1111.

In some examples, the metal-core balls can comprise a metallic material with a higher melting point than solder, such as copper. Accordingly, during the stage of connecting substrate interconnects 171 to substrate 11, the solder can be melted to be in a liquid phase to then be cured back to a solid phase, while the metal-core balls are maintained in the solid phase. In some examples, the solder of substrate interconnects 171 can comprise Sn, Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, a non-solder metal of substrate interconnects 171 can comprise copper, a copper alloy, aluminum, an aluminum alloy, nickel, a nickel alloy, gold, a gold alloy, silver or a silver alloy. In some examples, substrate interconnects 171 can have a thickness in the range of about 50 µm to about 350 µm. Substrate interconnects 171 can electrically connect substrate 11 to an external electronic component.

Figure 2C:
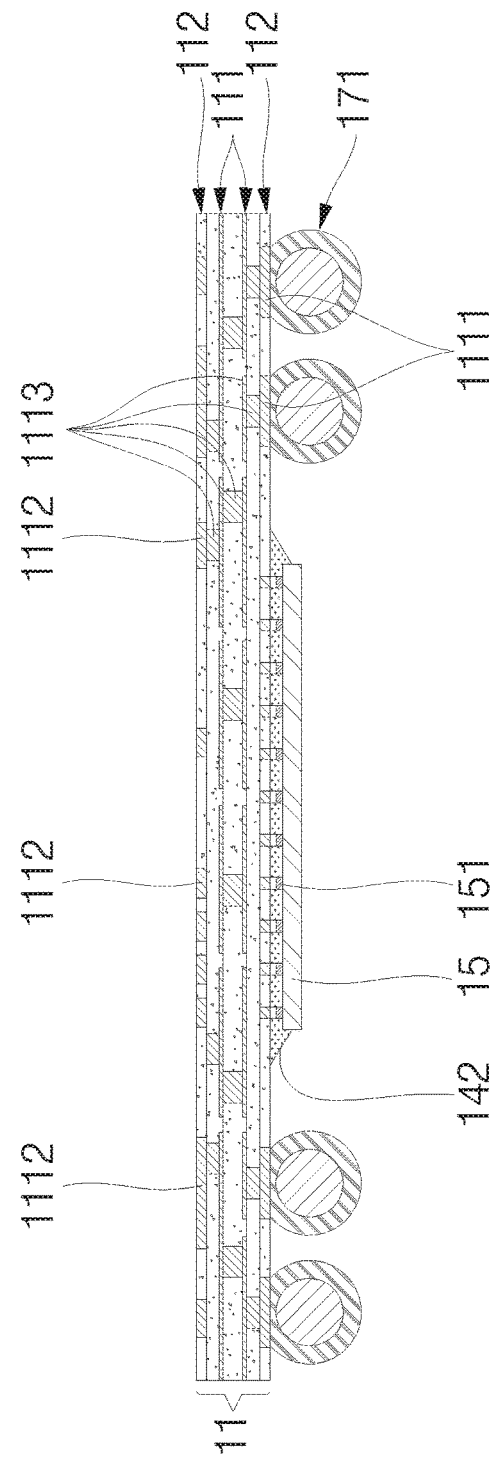

FIG. 2C shows a cross-sectional view at a later stage of manufacture of semiconductor device 10. In the example shown in FIG. 2C, first electronic component 15 can be provided. First electronic component 15 can be coupled, through first component terminals 151, to substrate bottom terminals 1111 of substrate 11. In some examples, first component terminals 151 can comprise or be referred to as pads, lands, UBMs, bumps, or pillars. First electronic component 15 comprises a top side or an active area side where electronic structures are formed, and a nonactive area side or bottom side opposite to the top side. In some examples, first component terminals 151 are adjacent to the top side of electronic component 15 and opposite to the bottom side.

In some examples, nonconductive paste or underfill 142 can be positioned between substrate 11 and first electronic component 15. In some examples, after nonconductive paste 142 is applied on substrate bottom terminals 1111 or first component terminals 151 of first electronic component 15, first component terminals 151 of first electronic component 15 can be connected to substrate bottom terminals 1111 through a thermal compression process while penetrating nonconductive paste 142.

In some examples, first component terminals 151 of first electronic component 15 can be coupled to substrate bottom terminals 1111 using a mass reflow process or a laser assisted bonding process, followed by performing a capillary underfill process that flows underfill 142 to a space between substrate 11 and first electronic component 15.

In some examples, underfill 142 can be omitted, or can be provided at a later stage. In some examples, underfill 142 can comprise part of bottom encapsulant 131. For instance, underfill 142 can be provided at a later stage as a molded underfill (MUF) along with encapsulant 131.

First electronic component 15 can comprise or be referred to as a chip, a die or a package. The chip or die can comprise an integrated circuit die separated from a semiconductor wafer. In some examples, first electronic component 15 can comprise a digital signal processor (DSP), a network processor, a power management processor, an audio processor, an RF circuit, a wireless baseband system-on-chip (SoC) processor, a sensor, or an application specific integrated circuit (ASIC). In some examples, first electronic component 15 can have a thickness in the range of about 50 µm to about 250 µm. In some examples, the thickness of first electronic component 15 can be smaller than the thickness of substrate interconnects 171. Accordingly, bottom surfaces of substrate interconnects 171 can be lower than a bottom surface (e.g., a bottom surface of a nonactive area) of first electronic component 15.

Figure 2D:
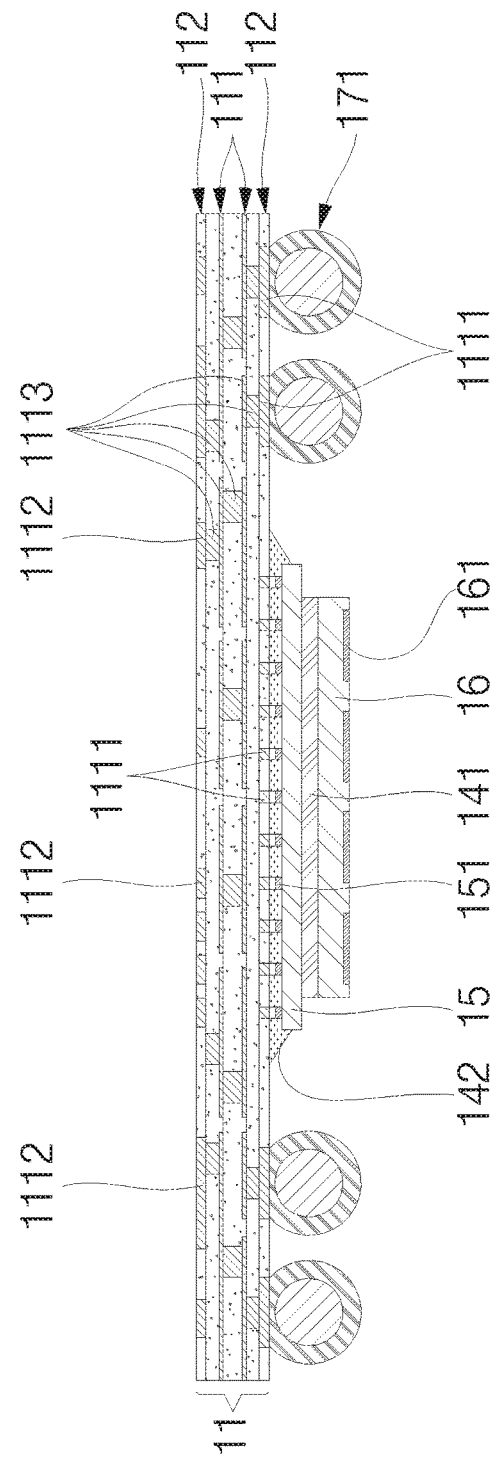

FIG. 2D shows a cross-sectional view of semiconductor device 10 at a later stage of manufacture. In the example shown in FIG. 2D, second electronic component 16 can be provided. Second electronic component 16 can comprise a nonactive area side or top side, and an active area side or a bottom side opposite to the top side. Second electronic component 16 can be bonded to first electronic component 15. In some examples, second electronic component 16 can be bonded to first electronic component 15 using adhesive 141. In some examples, adhesive 141 can comprise a thermally conductive adhesive that can permit thermal flow between first electronic component 15 and second electronic component 16. In some examples, first electronic component 15 and second electronic component 16 can be mechanically coupled to each other through adhesive 141, but can remain electrically insulated from each other.

In some examples, the nonactive area side or top side of second electronic component 16 can be bonded to the nonactive area side or bottom side of first electronic component 15. Second electronic component 16 can comprise second component terminals 161 that can be exposed or protruded over the active area side or bottom side of second electronic component 16. In some examples, first component terminals 151 and second component terminals 161 can face opposite directions. In some examples, second component terminals 161 can comprise or be referred to as pads, lands, UBMs, bumps, or pillars.

In some examples, first electronic component 15 and second electronic component 16 can be coupled to each other through an external electronic component (e.g., a main board or a mother board) outside of semiconductor device 10. In some examples, a thickness of second electronic component 16 can be greater than a thickness of first electronic component 15. In some examples, second electronic component 16 can have a width or a thickness smaller than, equal to, or greater than those of first electronic component 15.

In some examples, second electronic component 16 can comprise or be referred to as a chip, a die, or a package. The chip or die can comprise an integrated circuit die separated from a semiconductor wafer. In some examples, second electronic component 16 can comprise a digital signal processor (DSP), a network processor, a power management processor, an audio processor, an RF circuit, a wireless baseband system-on-chip (SoC) processor, a sensor, or an application specific integrated circuit (ASIC). In some examples, second electronic component 16 can have a thickness in the range of about 50 µm to about 250 µm. In some examples, stacked first component 15 and second electronic component 16 can have an overall thickness smaller than or equal to the thickness of substrate interconnects 171.

Figure 2E:
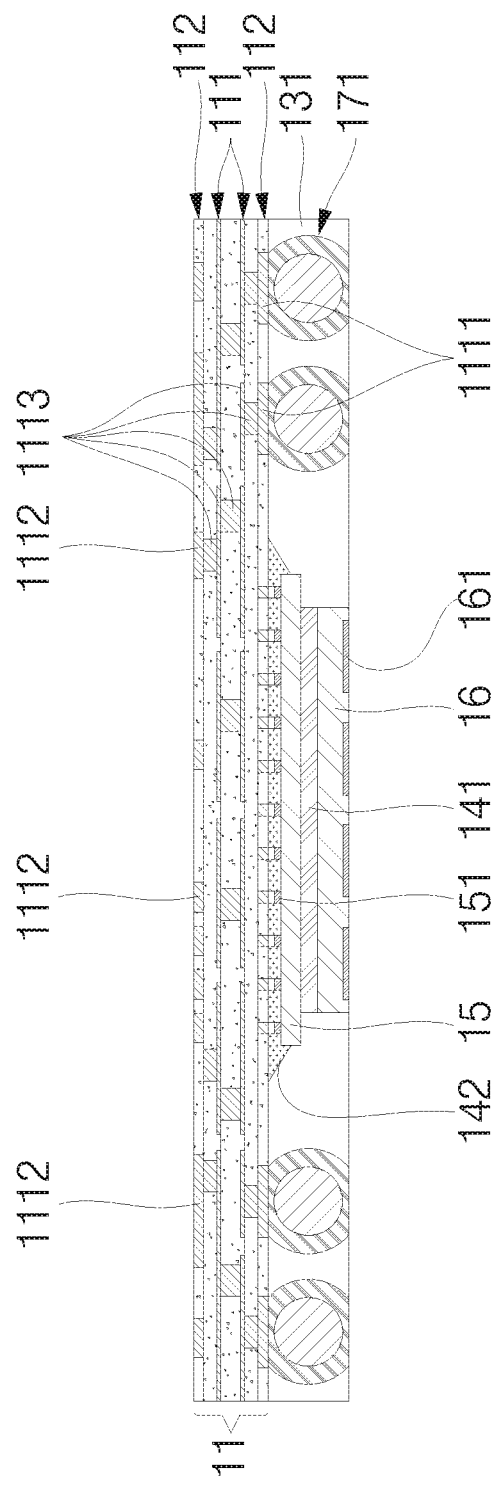

FIG. 2E shows a cross-sectional view at a later stage of manufacture of semiconductor device 10. In the example shown in FIG. 2E, bottom encapsulant 131 can be provided. Bottom encapsulant 131 can encapsulate a bottom side of substrate 11, substrate interconnects 171, first electronic component 15, and second electronic component 16. Bottom encapsulant 131 can comprise or be referred to as a mold compound, a resin, a sealant or an organic body. In some examples, an elastic film can first be placed or stretched on second electronic component 16 and substrate interconnects 171, and bottom encapsulant 131 then be injected between the elastic film and substrate 11 in a liquid state and then cured (e.g., through a film assisted molding process). In some examples, bottom encapsulant 131 can be formed using a variety of processes including, for example, a transfer molding process or a compression molding process. In some examples, a bottom side of second electronic component 16 or second component terminals 161, bottom sides of substrate interconnects 171, or a bottom side of bottom encapsulant 131, can be substantially coplanar.

In some examples, after initial encapsulation, bottom encapsulant 131 can initially cover or encapsulate lower ends of second component terminals 161 of second electronic component 16 or lower ends of substrate interconnects 171. A thinning process can then be performed to expose the desired features. For instance, the bottom side of bottom encapsulant 131 can be mechanically/chemically grinded or etched to expose or protrude the lower ends of second component terminals 161, or the lower ends of substrate interconnects 171, from bottom encapsulant 131.

In some examples, bottom encapsulant 131 can have a thickness in the range about 50 μm to about 350 μm, similar to the thickness of substrate interconnects 171. Bottom encapsulant 131 can provide protection for the bottom side of substrate 11, first electronic component 15, second electronic component 16, and substrate interconnects 171 from external environments.

Figure 2F:
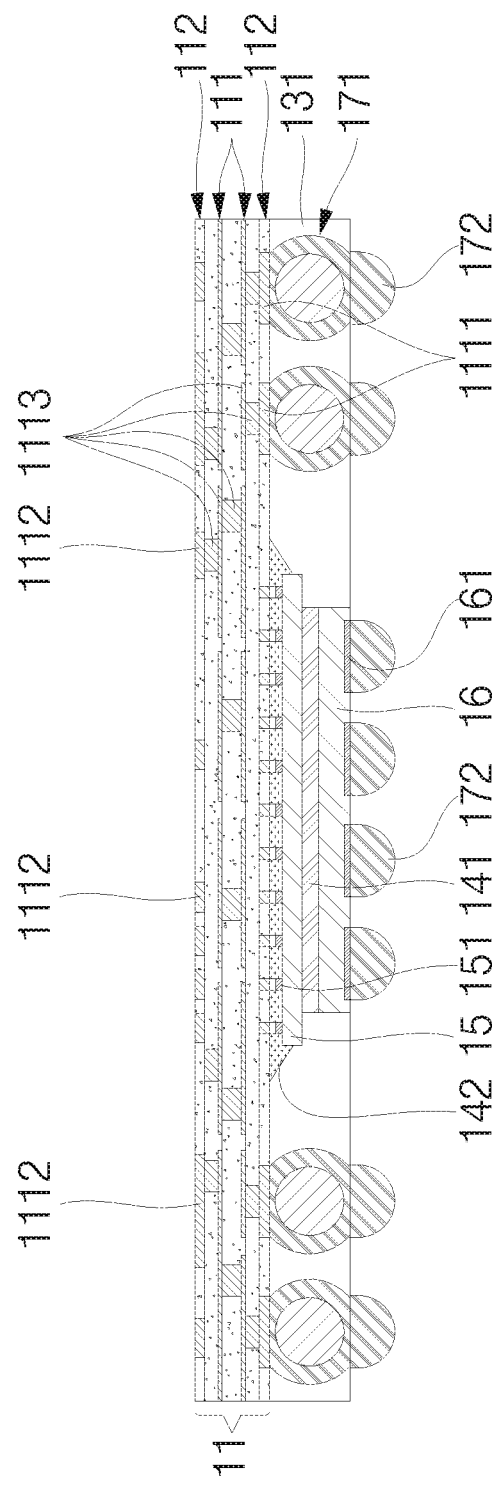

FIG. 2F shows a cross-sectional view of semiconductor device 10 at a later stage of manufacture. In the example shown in FIG. 2F, external interconnects 172 can be provided. External interconnects 172 can be coupled with substrate interconnects 171 or with second component terminals 161 of second electronic component 16, exposed through bottom encapsulant 131. External interconnects 172 can comprise or be referred to as solder balls, bumps or pillars. In some examples, external interconnects 172 can comprise Sn, Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, external interconnects 172 can be placed at substrate interconnects 171 or at second component terminals 161 and then subjected to mass reflow process or laser beam irradiation, electrically bonding external interconnects 172 with substrate interconnects 171 or with second component terminals 161. In some examples, after such bonding, external interconnects 172 can be integrally combined or merged with solder of substrate interconnects 171.

In some examples, external interconnects 172 can have a thickness in the range of about 10 μm to about 300 μm. Some of external interconnects 172 can electrically connect substrate 11 to an external electronic component, such as a main board or mother board, and some of external interconnects 172 can electrically connect second electronic component 16 to the external electronic component. In some examples, external interconnects 172 can be optional, or the semiconductor package with exposed second component terminals 161 and/or substrate interconnects 171 can represent a final product.

Figure 2G:
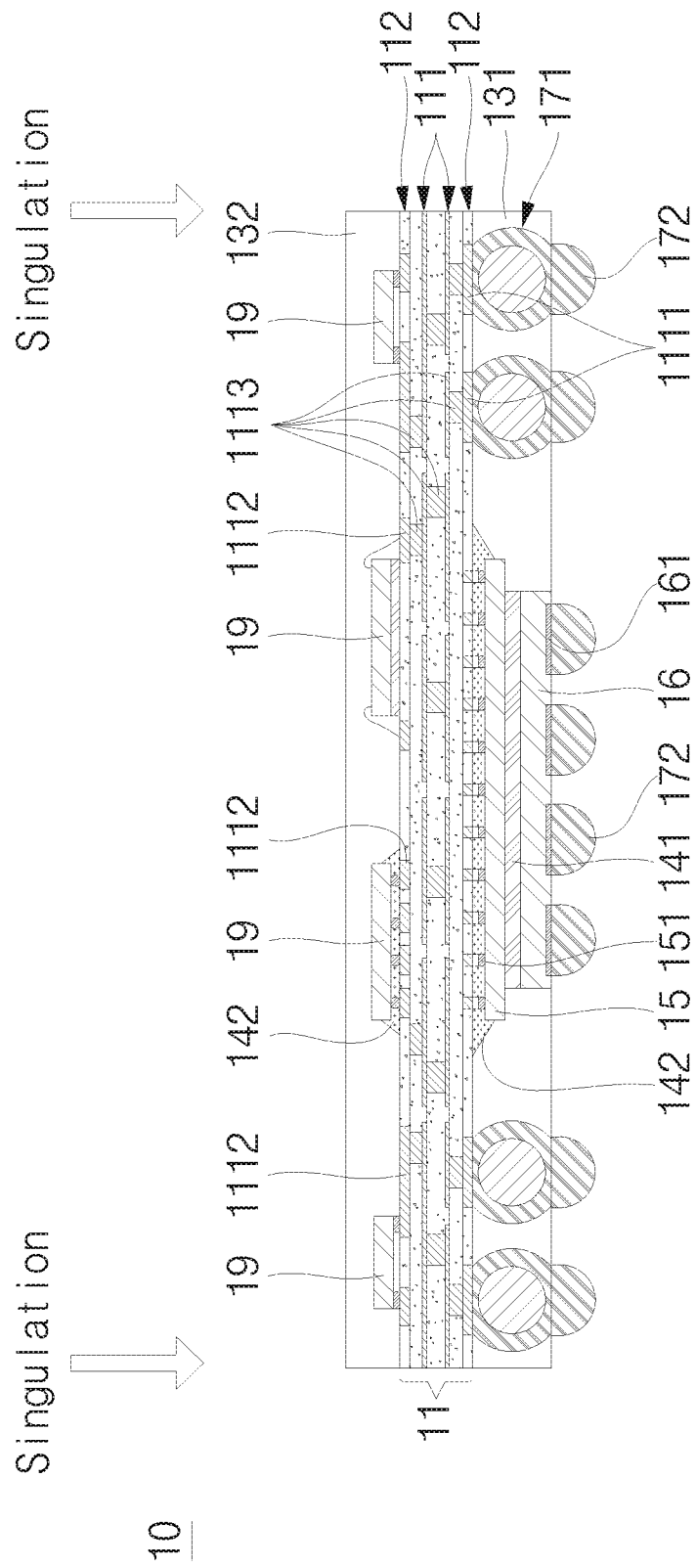

FIG. 2G shows a cross-sectional view of semiconductor device 10 at a later stage of manufacture. In the example shown in FIG. 2G, one or more top component 19 can be optionally provided. Top component 19 can be coupled to substrate top terminals 1112 provided on substrate 11. In some examples, top component 19 can be coupled to substrate 11 through a solder paste, solder balls, bumps, or wirebonds. In some examples, top component 19 can be mechanically bonded to substrate 11 through a nonconductive paste, an underfill, an adhesive, or a bonding film. Top component 19 can comprise or be referred to as a die, a chip, a package, an active component, or a passive component. In some examples, top component 19 can have a thickness in the range of about 50 μm to about 250 μm. Top component 19 can be coupled to first electronic component 15 through substrate 11.

In some examples, top encapsulant 132 can be optionally provided. Top encapsulant 132 can be provided at a top side of substrate 11, covering one more top components 19. Top encapsulant 132 can comprise or be referred to as a molding compound, a resin, a sealant or an organic body. In some examples, top encapsulant 132 can be formed using a variety of processes including, for example, a transfer molding process, a compression molding process or a film assisted molding process. In some examples, top encapsulant 132 can have a thickness in the range of about 50 μm to about 300 μm. Top encapsulant 132 can provide protection for the top side of substrate 11 and top component 19 from external environments.

In some examples, the stages of FIG. 2G for providing top component 19 or top encapsulant 132 can be performed right after providing substrate 11 (FIG. 2A), before providing substrate interconnects 171 (FIG. 2B), before providing first electronic component 15 (FIG. 2C), or before providing second electronic component 16 (FIG. 2D).

In some examples, a singulation process can be performed. In order to improve the manufacturing yield, semiconductor device 10 can be manufactured as part of a strip type configuration including multiple semiconductor devices 10 in a row, or a matrix type configuration including multiple semiconductor device 10 in columns and rows. The singulation process can be performed to separate adjacent semiconductor devices 10 from each other. The singulation process can be performed by sawing substrate 11 and bottom encapsulant 131 using a diamond wheel or laser beam. In some examples, when top encapsulant 132 is provided, top encapsulant 132 can also be sawed with substrate 11 and bottom encapsulant 131 during the singulation process. By the singulation process, lateral sides of substrate 11 can be coplanar with lateral sides of bottom encapsulant 131. In some examples, if top encapsulant 132 is provided, the lateral sides of substrate 11, bottom encapsulant 131 and top encapsulant 132 can be coplanar.

Figure 3:
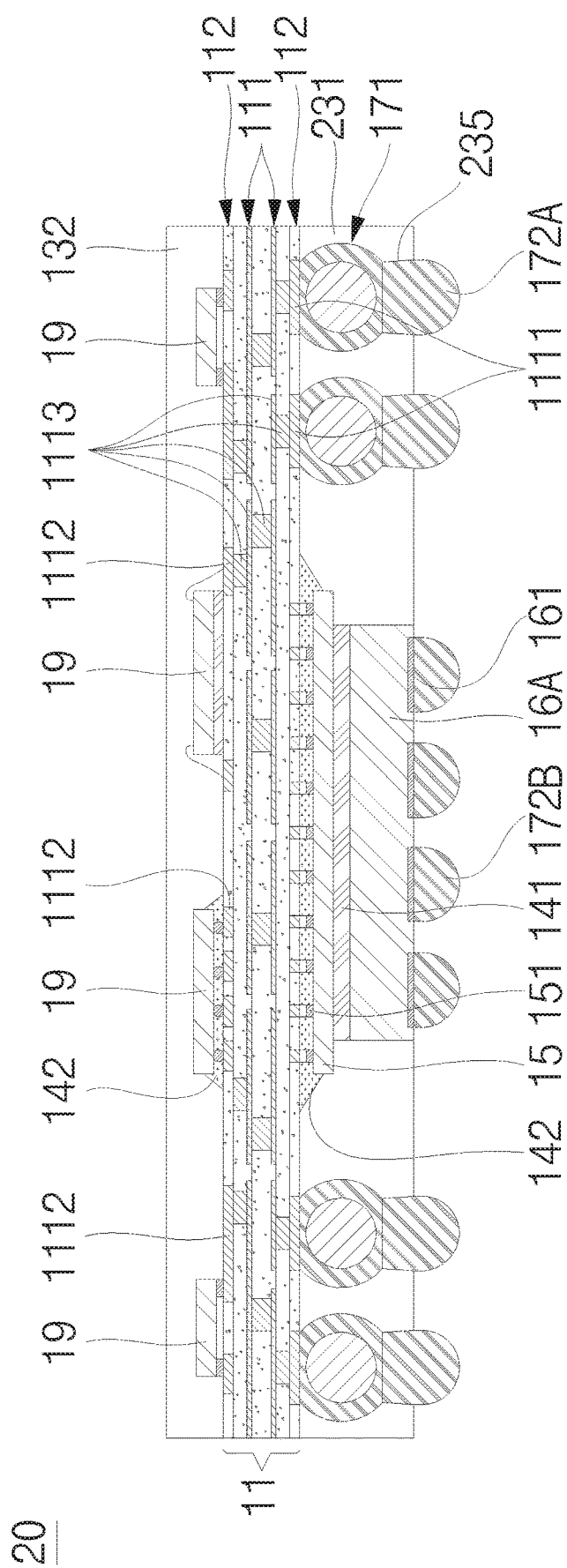
FIG. 3 shows a cross-sectional view of an example semiconductor device.

FIG. 3 shows a cross-sectional view of an example semiconductor device 20. In some examples, features, materials, or manufacturing of semiconductor device 20 can be similar to those of other semiconductor devices described in this disclosure. Semiconductor device 20 comprises bottom encapsulant 231 that can be thicker than substrate interconnects 171, such that external interconnects 172A couple with substrate interconnects 171 through encapsulant via 235 extended into bottom encapsulant 231. The following description will focus on differences between semiconductor device 20 and semiconductor device 10.

In the example shown in FIG. 3, second electronic component 16A can be thicker than second electronic component 16 shown in FIG. 1. However, substrate interconnects 171 can have a thickness similar to that of substrate interconnects 171 shown in FIG. 1. The bottom surface of second electronic component 16A can be lower than that substrate interconnects 171. In some examples, the bottom surface of bottom encapsulant 231 can be lower than that of substrate interconnects 171.

External interconnects 172A can be connected to substrate interconnects 171 through encapsulant vias 235 of bottom encapsulant 231. In some examples, lateral sides of external interconnects 172A can be covered by bottom encapsulant 231. In some examples, a bottom side of bottom encapsulant 231 can be substantially coplanar with a bottom side of second electronic component 16A.

FIGS. 4A, 4B, 4C, 4D, and 4E show cross-sectional views of an example method for manufacturing semiconductor device 20. Many aspects of the method for manufacturing semiconductor device 20 can be similar to the method for manufacturing semiconductor device 10 shown in FIGS. 2A to 2G. Therefore, the following description will focus on differences between the methods for manufacturing semiconductor device 20 and semiconductor device 10.

FIG. 4A shows a cross-sectional view at a stage of manufacture of semiconductor device 20. In the example shown in FIG. 4A, second electronic component 16A can be provided. Second electronic component 16A can be bonded on first electronic component 15 through adhesive 141. In some examples, the thickness of second electronic component 16A can be in the range of about 50 μm to about 250 μm. The bottom surface of second electronic component 16A can be lower than that of each of substrate interconnects 171.

FIG. 4B shows a cross-sectional view at a later stage of manufacture of semiconductor device 20. In the example shown in FIG. 4B, bottom encapsulant 231 can be provided. In some examples, features, materials, or formation of bottom encapsulant 231 can be similar to bottom encapsulant 131. Bottom encapsulant 231 can cover a bottom side of substrate 11, substrate interconnects 171, first electronic component 15, and second electronic component 16A. In some examples, bottom encapsulant 231 can cover not only lateral sides but also lower ends of substrate interconnects 171. Bottom encapsulant 131 can comprise or be referred to as a molding compound, a resin, a sealant or an organic body. In some examples, bottom encapsulant 231 can be provided by a film assisted molding process, a transfer molding process or a compression molding process. In some examples, a bottom side of second electronic component 16A can be coplanar with a bottom side of bottom encapsulant 231.

In some examples, after initial encapsulation, bottom encapsulant 231 can initially cover or encapsulate the bottom side of second electronic component 16A or lower ends of second component terminals 161. A thinning process can then be performed to expose the desired features. For instance, the bottom side of bottom encapsulant 231 can be mechanically/chemically grinded or etched to expose or protrude the bottom side of second electronic component 16A, or the lower ends of second component terminals 161, from bottom encapsulant 231.

In some examples, the bottom side of bottom encapsulant 231 can be substantially coplanar with the bottom side of second electronic component 16A or with the lower ends of second component terminals 161. In some examples, bottom encapsulant 231 can have a thickness in the range about 50 μm to about 350 μm, similar to the range of an overall thickness of stacked first electronic component 15 and second electronic component 16A. Bottom encapsulant 231 can provide protection for the bottom side of substrate 11, first electronic component 15, second electronic component 16A, and substrate interconnects 171 from external environments.

FIG. 4C shows a cross-sectional view of semiconductor device 20 at a later stage of manufacture. In the example shown in FIG. 4C, encapsulant vias 235 can be provided at regions of bottom encapsulant 231 aligned with substrate interconnects 171. In some examples, encapsulant vias 235 can be provided by ablation of bottom encapsulant 231, using laser beam, mechanical drill, or chemical etching, to expose lower ends of substrate interconnects 171. In some examples, encapsulant vias 235 can have a thickness in the range of about 50 μm to about 300 μm.

FIG. 4D shows a cross-sectional view of semiconductor device 20 at a later stage of manufacture. In the example shown in FIG. 4D, external interconnects 172A and 172B can be provided. External interconnects 172A,172B can be coupled to regions of substrate interconnects 171 exposed through encapsulant vias 235 of bottom encapsulant 231, or to second component terminals 161 of second electronic component 16, respectively. External interconnects 172A coupled to substrate interconnects 171 can be in contact with bottom encapsulant 231 through encapsulant vias 235, and external interconnects 172B coupled to second component terminals 161 can be separated from bottom encapsulant 231.

In some examples, a thickness of each of external interconnects 172A coupled to substrate interconnects 171 through encapsulant vias 235 can be different from, such as greater than, that of external interconnects 172B coupled to second component terminals 161 of second electronic component 16.

In some examples, lower ends of external interconnects 172A coupled to substrate interconnects 171 through encapsulant vias 235 can be substantially coplanar with lower ends of external interconnects 172B coupled to second component terminals 161 of second electronic component 16.

In some examples, external interconnects 172A and 172B be reflowed, such as by a mass reflow process or a laser beam irradiation, to respectively bond them to substrate interconnects 171 and second component terminals 161. External interconnects 172A or 172B can have a thickness in the range of about 50 μm to about 300 μm. External interconnects 172A,172B can electrically connect semiconductor device 20 to an external electronic component, such as a main board or mother board.

Figure 4E:
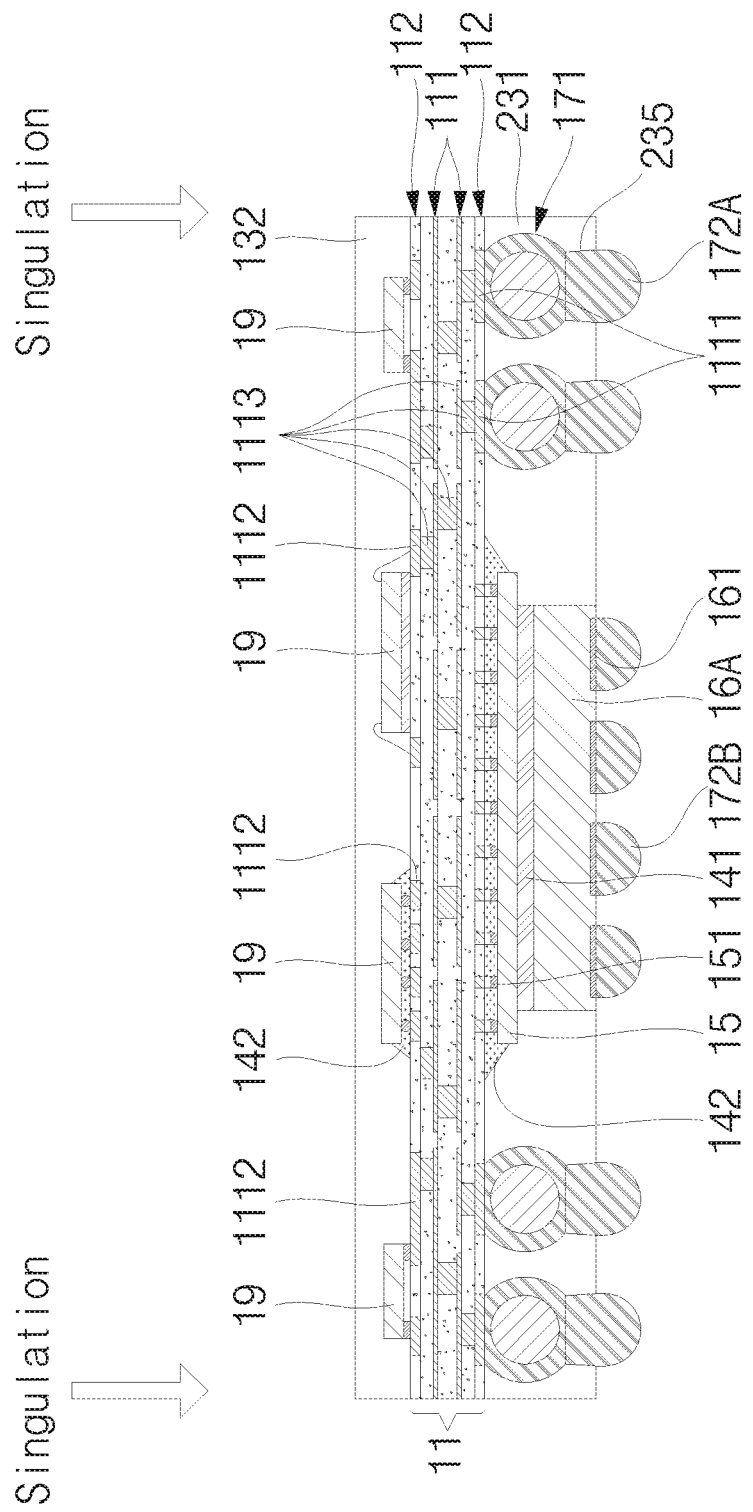

FIG. 4E shows a cross-sectional view of semiconductor device 20 at a later stage of manufacture. In the example shown in FIG. 4E, similar to the description of FIG. 2G, one or more optional top components 19 or optional top encapsulant 132 can be provided, and singulation can be performed.

Figure 5:
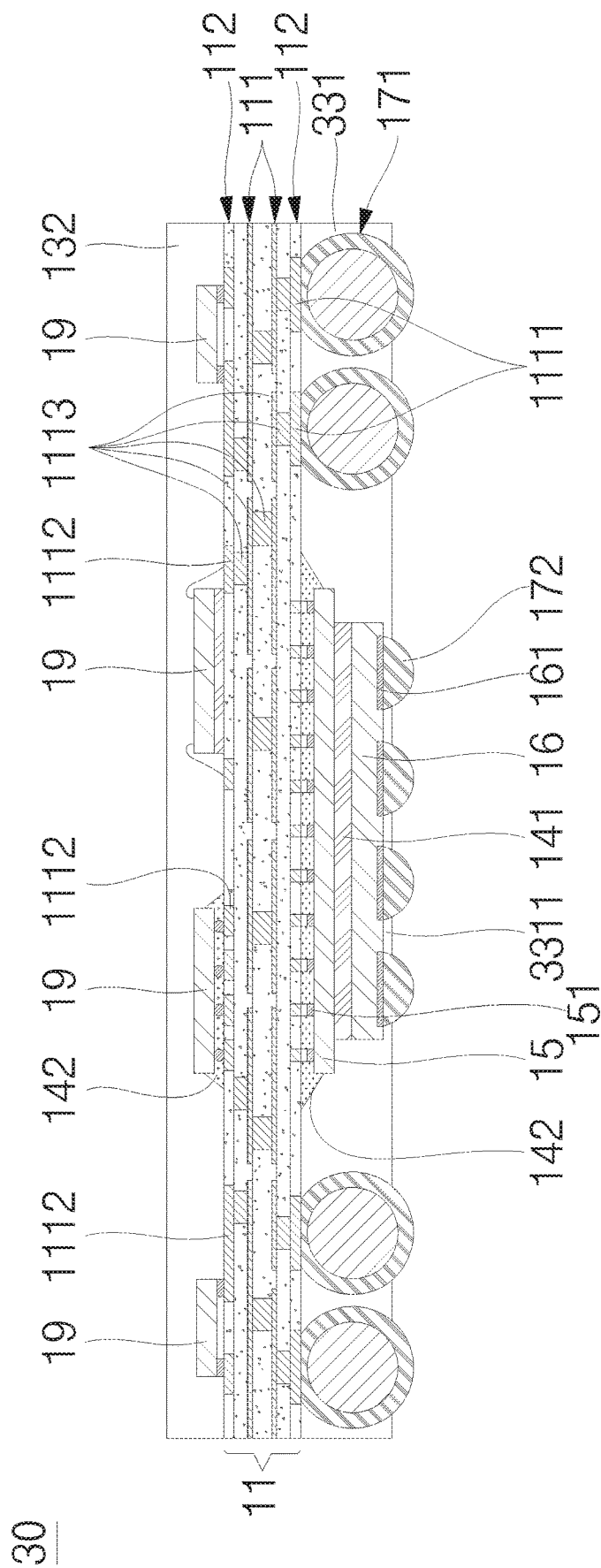
FIG. 5 shows a cross-sectional view of an example semiconductor device.

FIG. 5 shows a cross-sectional view of an example semiconductor device 30. In some examples, features, materials, or manufacturing of semiconductor device 30 can be similar to those of other semiconductor devices described in this disclosure. In the example shown in FIG. 5 for semiconductor device 30 substrate interconnects 171 can protrude from encapsulant 331, or encapsulant portion 3311 can cover the bottom side of second electronic component 16. The following description will focus on differences between semiconductor device 30 and semiconductor device 10.

In the example shown in FIG. 5, substrate interconnects 171 can have a thickness greater than that of substrate interconnects 171 shown in FIG. 1. In some examples, the thickness of substrate interconnects 171 can be greater than an overall thickness of stacked first electronic component 15 and second electronic component 16. In some examples, the lower end of substrate interconnects 171 can protrude lower than the bottom of bottom encapsulant 331. In some examples, encapsulant portion 3311 can cover the bottom side of second electronic component 16. In some examples, encapsulant portion 3311 can cover lateral sides of external interconnects 172.

FIGS. 6A to 6B show cross-sectional views of an example method for manufacturing semiconductor device 30. The method for manufacturing semiconductor device 30 can be similar to the method for manufacturing for semiconductor device 10 described with respect to FIG. 2. The following description will focus on differences between such methods.

FIG. 6A shows a cross-sectional view at a stage of manufacture of semiconductor device 30. In some examples, the stage of FIG. 6A be reached through stages similar to the stages shown and described with respect to FIGS. 2A-2D. In the example shown in FIG. 6A, substrate interconnects 171 and external interconnects 172 can be provided.

Substrate interconnects 171 can be coupled to substrate bottom terminals 1111 of substrate 11. In some examples, substrate interconnects 171 can be coupled to substrate bottom terminals 1111 provided around stacked first electronic component 15 and second electronic component 16. In some examples, substrate interconnects 171 can have a thickness greater than an overall thickness of stacked first electronic component 15 and second electronic component 16.

External interconnects 172 can be coupled to second component terminals 161 of second electronic component 16. In some examples, the lower ends of substrate interconnects 171 can be substantially coplanar with the lower ends of external interconnects 172. In some examples, external interconnects 172 can have a thickness in the range of about 50 µm to about 300 µm.

FIG. 6B shows a cross-sectional view at a later stage of manufacture of semiconductor device 30. In the example shown in FIG. 6B, bottom encapsulant 331 can be provided. In some examples, features, materials, or formation bottom encapsulant 331 can be similar to bottom encapsulant 131. Bottom encapsulant 331 can cover a bottom side of substrate 11, lateral sides of substrate interconnects 171, lateral sides of first electronic component 15 and second electronic component 16, and lateral sides of external interconnects 172. Bottom encapsulant 331 provided at the bottom side of second electronic component 16 can be defined as encapsulant portion 3311. In some examples, lower ends of substrate interconnects 171 or of external interconnects 172 can be exposed or protruded through the bottom side of bottom encapsulant 331.

In some examples, an elastic film can first be placed or stretched on substrate interconnects 171 and external interconnects 172, and bottom encapsulant 331 can then be injected between the elastic film and substrate 11 in a liquid state and then cured (e.g., through a film assisted molding process).

Bottom encapsulant 331 can be provided at the bottom side of substrate 11 and can encapsulate the lateral sides of substrate interconnects 171 and the lateral sides of external interconnects 172 while encapsulating first electronic component 15 and second electronic component 16. In some examples encapsulant portion 3311 can be optional, such that the bottom side of second electronic component 16 can be exposed from, or can be substantially coplanar with, the bottom side of bottom encapsulant 331. In some examples, bottom encapsulant 331 can have a thickness in the range of about 50 µm to about 300 µm. In some examples, encapsulant portion 3311 can have a thickness in the range of about 0 µm to about 50 µm.

Figure 7:
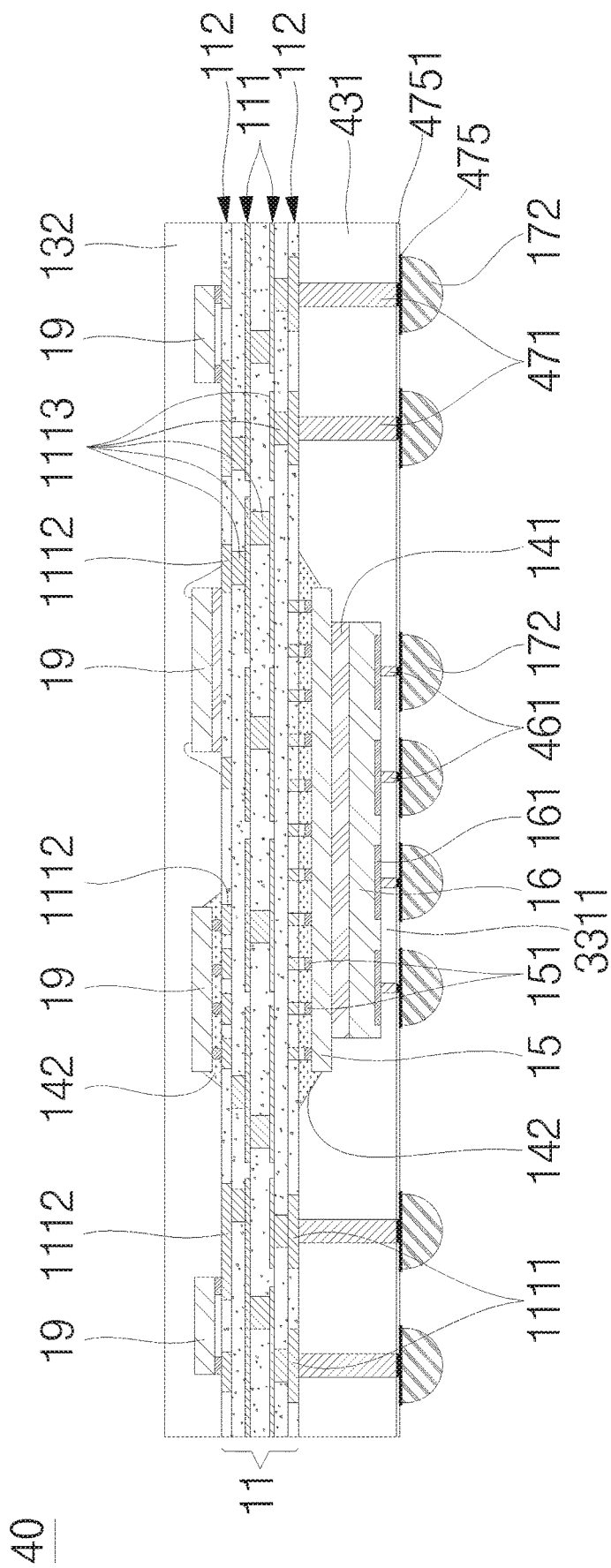
FIG. 7 shows a cross-sectional view of an example semiconductor device.

FIG. 7 shows a cross-sectional view of an example semiconductor device 40. In some examples, respective elements, materials, or manufacturing stages of semiconductor device 40 can be similar to those of other semiconductor devices described in this disclosure. For instance, semiconductor device 40 can be similar to semiconductor device 30 described with respect to FIGS. 5-6, and can have narrower substrate interconnects 471 under substrate 11, or component interconnects 461 under second electronic component 16. The following description will focus on differences between semiconductor device 40 and semiconductor device 30.

In the example shown in FIG. 7, the widths of substrate interconnects 471 can be narrower than those of substrate interconnects 171 shown in FIG. 5. Component interconnects 461 can be provided on, or can be part of, second component terminals 161 of second electronic component 16. Component interconnects 461 can be positioned between the bottom side of electronic component 16 and external interconnects 172. In some examples, lower ends of substrate interconnects 471 coupled to substrate 11, and lower ends of component interconnects 461 coupled to second electronic component 16, can be substantially coplanar.

In some examples, optional external terminals 475 can be positioned between the lower ends of substrate interconnects 471 and external interconnects 172, or between the lower ends of component interconnects 461 and external interconnects 172. In some examples, external terminals 475 can comprise or be referred to as pads or UBM, or can be defined by a conductive layer formed under bottom encapsulant 331. In some examples, a dielectric layer 4751 can be formed first under bottom encapsulant 331, with openings for exposing substrate interconnects 471 and component interconnects 461, and then external terminals 475 can be formed on or through dielectric layer 4751. In some examples, dielectric layer 4751 can be made from photo-definable organic dielectric materials such as, for example, polyimide (PI), benzocyclobutene (BCB), or polybenzoxazole (PBO).

Figure 8C:
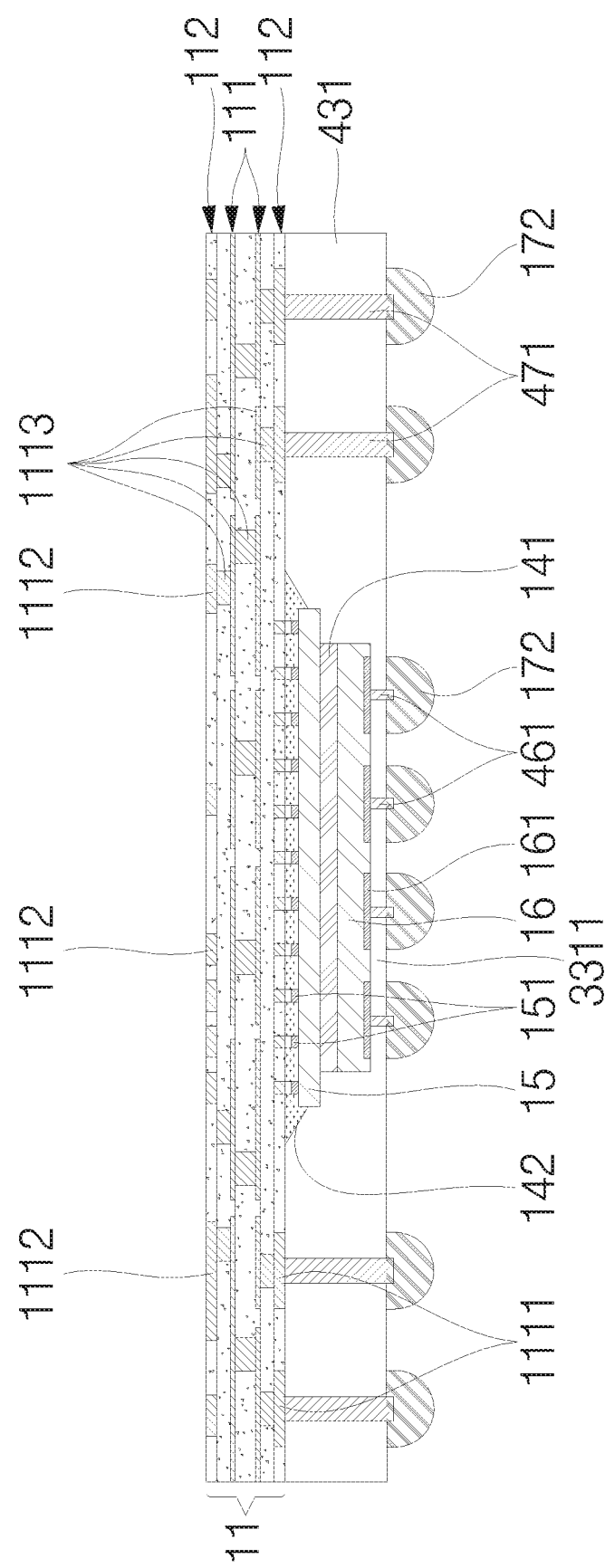

FIGS. 8A, 8B, and 8C show cross-sectional views of an example method for manufacturing semiconductor device 40. The method for manufacturing semiconductor device 40 can be similar to the method for manufacturing semiconductor device 10 described with respect to FIG. 2. The following description will focus on differences between such methods.

FIG. 8A shows a cross-sectional view at a stage of manufacture of semiconductor device 40. In some examples, the stage of FIG. 8A be reached through stages similar to the stages shown and described with respect to FIGS. 2A-2D, but providing substrate interconnects 471 and component interconnects 461.

Substrate interconnects 471 can be provided on substrate bottom terminals 1111 of substrate 11. In some examples, substrate interconnects 471 can be a subset of the options described with respect to substrate interconnects 171. In some examples, substrate interconnects 471 can comprise or be referred to as studs or posts, such as pillars or vertical wires. In some examples, substrate interconnects 471 can comprise copper, aluminum, gold, silver, or nickel. Substrate interconnects 471 can be formed using, for example, physical vapor deposition (PVD), chemical vapor deposition (CVD), atomic layer deposition (ALD), plasma vapor deposition, electroless plating, electrolytic plating, or vertical wirebonding. Substrate interconnects 471 can have a height in the range of about 50 µm to about 300 µm, or a width in the range of about 5 µm to about 50 µm. Substrate interconnects 471 can couple substrate bottom terminals 1111 of substrate 11 with external interconnects 172. In some examples, substrate interconnect 471 can be provided in the stage described with respect to FIG. 2B for corresponding substrate interconnects 171, prior to coupling of first electronic component 15 or second electronic component 16.

Component interconnects 461 can be provided on second component terminals 161 of second electronic component 16. In some examples, component interconnects 461 can be considered part of second component terminals 161, or can be a subset of the options described with respect to second component terminals 161. In some examples, component interconnects 461 can comprise or be referred to as bumps, studs, or posts, such as pillars or vertical wires. In some examples, component interconnects 461 can comprise copper, aluminum, gold, silver, nickel, or solder. Component interconnects 461 can be formed using, for example, physical vapor deposition (PVD), chemical vapor deposition (CVD), atomic layer deposition (ALD), plasma vapor deposition, electroless plating, electrolytic plating, or vertical wirebonding. Component interconnects 461 can have a height in the range of about 1 μm to about 50 μm, or a width in the range of about 5 μm to about 50 μm. Component interconnects 461 can couple second component terminals 161 of second electronic component 16 to external interconnects 172. In some examples, component interconnects 461 are formed or are present as part of second electronic component 16 prior to attachment of electronic component 16.

FIG. 8B shows a cross-sectional view at a later stage of manufacture of semiconductor device 40. In the example shown in FIG. 8B, bottom encapsulant 431 can be provided. In some examples, features, materials, or formation bottom encapsulant 431 can be similar to bottom encapsulant 331. Bottom encapsulant 431 can encapsulate a bottom side of substrate 11, substrate interconnects 471, first electronic component 15, second electronic component 16, or component interconnects 461. In some examples, bottom encapsulant 431 can be provided at a bottom side of second electronic component 16, and a portion of bottom encapsulant 431, defined as encapsulant portion 3311, can encapsulate lateral sides of component interconnects 461.

Lower ends of substrate interconnects 471 can be exposed or protruded through the bottom side of bottom encapsulant 431. Lower ends of component interconnects 461 can be exposed or protruded through encapsulant portion 3311. In some examples, lower ends of substrate interconnects 471 or lower ends of component interconnects 461 can be substantially coplanar with the bottom side of bottom encapsulant 431. In some examples, lower ends of substrate interconnects 471 or lower ends of component interconnects 461 can be protrude from the bottom side of bottom encapsulant 431.

In some examples, bottom encapsulant 431 can have a thickness in the range of about 50 μm to about 300 μm, or encapsulant portion 3311 can have a thickness in the range of about 1 μm to about 50 μm. Bottom encapsulant 431 and encapsulant portion 3311 can be formed using a variety of processes including, for example, a film assisted molding process, a transfer molding process, and a compression molding. In some examples, an elastic film can first be placed on lower ends of substrate interconnects 471 or lower ends of component interconnects 461, and bottom encapsulant 431 can then be injected between the elastic film and substrate 11 in a liquid state and then cured (e.g., using a film assisted molding process). In some examples, after initial encapsulation, bottom encapsulant 431 can initially cover or encapsulate lower ends of substrate interconnects 471 or lower ends of component interconnects 461. A thinning process can then be performed to expose the desired features. For instance, the bottom side of bottom encapsulant 431 can be mechanically/chemically grinded or etched to expose or protrude the lower ends of substrate interconnects 471, or the lower ends of component interconnects 461, from bottom encapsulant 431.

FIG. 8C shows a cross-sectional view at a later stage of manufacture of semiconductor device 40. In the example shown in FIG. 8C, external interconnects 172 can be provided. External interconnects 172 can be coupled to lower ends of substrate interconnects 471 exposed through bottom encapsulant 431 and lower ends of component interconnects 461 exposed through encapsulant portion 3311, respectively. In some examples, the lower ends or substrate interconnect 471, or the lower ends of component interconnects 461, can protrude into external interconnects 172. External interconnects 472 can have a thickness in the range of about 50 μm to about 300 μm. External interconnects 172 can electrically connect semiconductor device 40 to an external electronic component, such as a main board.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. A semiconductor device, comprising:
  a substrate comprising a substrate top side, an opposing substrate bottom side, and a conductive structure, wherein:
    the conductive structure comprises:
      substrate top terminals adjacent to the substrate top side;
      substrate bottom terminals adjacent to the substrate bottom side; and
      conductive paths coupling the substrate top terminals to the substrate bottom terminals;
  a first electronic component comprising:
    a first electronic component first side;
    a first electronic component second side opposite to the first electronic component first side; and
    first component terminals adjacent to the first electronic component first side and coupled to the substrate bottom terminals;
  a second electronic component comprising:
    a second electronic component first side;
    a second electronic component second side opposite to the second electronic component first side and bonded to the first electronic component second side with an adhesive; and
    second component terminals adjacent to the second electronic component first side;
  substrate interconnects coupled to the substrate bottom terminals; and
  a bottom encapsulant covering the substrate bottom side, the first electronic component, the second electronic component, the adhesive, and the substrate interconnects,
  wherein:
    the first electronic component and the second electronic component are interposed between the second component terminals and the substrate bottom side; and
    portions of the second component terminals and the substrate interconnects are exposed from the bottom encapsulant.

2. The semiconductor device of claim 1, wherein:
  the substrate interconnects comprise a first thickness; and
  the first electronic component, the adhesive, and the second electronic component combined provide a second thickness.

3. The semiconductor device of claim 2, wherein:
  the first thickness is greater than the second thickness; and
  the semiconductor device further comprises external interconnects coupled to the second component terminals adjacent to a bottom side of the bottom encapsulant.

4. The semiconductor device of claim 2, wherein:
  the first thickness and the second thickness are substantially equal; and
  the semiconductor device further comprises external interconnects coupled to the substrate interconnects and the second component terminals adjacent to a bottom side of the bottom encapsulant.

5. The semiconductor device of claim 2, wherein:
the first thickness is less than the second thickness;
the semiconductor device further comprises:
vias in the bottom encapsulant extending from a bottom side of the bottom encapsulant to the substrate interconnects;
first external interconnects coupled to the substrate interconnects through the vias; and
second external interconnects coupled to the second component terminals.

6. The semiconductor device of claim 1, further comprising:
external interconnects coupled to the second component terminals, wherein:
the bottom encapsulant includes an encapsulant portion over the second electronic component first side between the external interconnects; and
the substrate interconnects protrude below a bottom surface of the bottom encapsulant.

7. The semiconductor device of claim 1, further comprising:
a third electronic component adjacent to the substrate top side; and
a top encapsulant covering the third electronic component and contacting the substrate top side.

8. The semiconductor device of claim 1, wherein:
the substrate comprises a coreless substrate.

9. The semiconductor device of claim 1, wherein:
the substrate interconnects comprise one or more metal-core balls comprising a metal having a higher melting point than solder; and
the semiconductor device further comprises:
an underfill that extends between the substrate bottom side and the first electronic component device first side, and that covers a lateral side of the first electronic device.

10. The semiconductor device of claim 1, wherein:
the substrate interconnects comprise first posts;
the second component terminals further comprise second posts;
the bottom encapsulant covers side surfaces of the second posts; and
the semiconductor device further comprises:
external interconnects coupled to the first posts and to the second posts adjacent to a bottom side of the bottom encapsulant.

11. A semiconductor device, comprising:
a substrate comprising a substrate top side, an opposing substrate bottom side, and a conductive structure;
a first electronic component comprising:
a first electronic component first side;
a first electronic component second side opposite to the first electronic component first side; and
first component terminals adjacent to the first electronic component first side, wherein:
the first component terminals face the substrate bottom side and are coupled to the conductive structure;
a second electronic component comprising:
a second electronic component first side;
a second electronic component second side opposite to the second electronic component first side; and
second component terminals adjacent to the second electronic component first side,
wherein:
the second electronic component second side is coupled to the first electronic component second side so that the first component terminals and the second component terminals face opposite directions;
substrate interconnects coupled to the conductive structure adjacent to the substrate bottom side;
a bottom encapsulant covering the substrate bottom side, the first electronic component, the second electronic component, and the substrate interconnects;
a third electronic component adjacent to the substrate top side;
an electronic chip attached to the substrate top side in a flip-chip configuration; and
a top encapsulant covering the third electronic component and contacting the substrate top side,
wherein:
portions of the second component terminals and the substrate interconnects are exposed from a bottom side of the bottom encapsulant;
the second electronic component second side is attached to the first electronic component second side with an adhesive; and
the bottom encapsulant covers portions of the adhesive.

12. The semiconductor device of claim 11, wherein:
the substrate further comprises a dielectric structure;
the conductive structure comprises:
substrate top terminals adjacent to the substrate top side;
substrate bottom terminals adjacent to the substrate bottom side; and
conductive paths coupling the substrate top terminals to the substrate bottom terminals;
the first component terminals are coupled to a first set of substrate bottom terminals;
the substrate interconnects are coupled to a second set of substrate bottom terminals;
the substrate interconnects comprise metal-core balls comprising a metal having a higher melting point than solder; and
the semiconductor device further comprises external interconnects coupled to one or more of the substrate interconnects or the second component terminals.

13. The semiconductor device of claim 11, further comprising:
vias in the bottom encapsulant extending from the bottom side of the bottom encapsulant to the substrate interconnects;
first external interconnects coupled to the substrate interconnects through the vias; and
second external interconnects coupled to the second component terminals,
wherein:
the first external interconnects are taller than the second external interconnects.

14. The semiconductor device of claim 11, wherein:
the substrate interconnects comprise first posts;
the second component terminals further comprise second posts;
the bottom encapsulant covers side surfaces of the second posts; and
the semiconductor device further comprises:
external interconnects coupled to the first posts and to the second posts adjacent to a bottom side of the bottom encapsulant.

15. A method of forming a semiconductor device, comprising:
  providing a substrate comprising a substrate top side, an opposing substrate bottom side, and a conductive structure;
  providing a first electronic component comprising:
    a first electronic component first side;
    a first electronic component second side opposite to the first electronic component first side; and
    first component terminals adjacent to the first electronic component first side,
  providing a second electronic component comprising:
    a second electronic component first side;
    a second electronic component second side opposite to the second electronic component first side; and
    second component terminals adjacent to the second electronic component first side;
  providing substrate interconnects;
  in any order:
    coupling the first component terminals to the conductive structure adjacent to the substrate bottom side such that first component terminals are interposed between the first electronic component first surface and the substrate bottom side;
    coupling the substrate interconnects to the conductive structure adjacent to the substrate bottom side; and
    attaching the second electronic component second side to the first electronic component second side with an adhesive so that the first component terminals and the second component terminals face opposite directions;
  and
  providing a bottom encapsulant covering the substrate bottom side, the first electronic component, the second electronic component, the adhesive, and the substrate interconnects;
  wherein:
    portions of the second component terminals and of the substrate interconnects are exposed from a bottom side of the bottom encapsulant.

16. The method of claim 15, wherein:
  providing the conductive structure comprises providing:
    substrate top terminals adjacent to the substrate top side;
    substrate bottom terminals adjacent to the substrate bottom side; and
    conductive paths coupling the substrate top terminals to the substrate bottom terminals;
  coupling the first component terminals comprises coupling the first component terminals to a first set of the substrate bottom terminals;
  coupling the substrate interconnects comprises coupling the substrate interconnects to a second set of the substrate bottom terminals;
  providing the substrate interconnects comprises providing metal-core structures comprising a metal having a higher melting point than solder; and
  the method further comprises:
    coupling external interconnects to one or more of the substrate interconnects or the second component terminals.

17. The method of claim 15, further comprising:
  providing external interconnects coupled to the second component terminals,
  wherein:
    the bottom encapsulant includes an encapsulant portion over the second electronic component first side between the external interconnects; and
    the substrate interconnects protrude below a bottom surface of the bottom encapsulant.

18. The method of claim 15, wherein:
  providing the substrate interconnects comprises providing first posts;
  providing the second electronic component comprises providing the second component terminals further including second posts;
  providing the bottom encapsulant comprises covering side surfaces of the second posts; and
  the method further comprises:
    providing external interconnects coupled to first posts and the second posts adjacent to a bottom side of the bottom encapsulant.

19. The method of claim 15, further comprising:
  attaching a third electronic component adjacent to the substrate top side; and
  providing a top encapsulant covering the third electronic component and contacting the substrate top side.

* * * * *